US006967512B2

(12) United States Patent
Kozaki

(10) Patent No.: US 6,967,512 B2
(45) Date of Patent: Nov. 22, 2005

(54) MULTIPHASE-CLOCK PROCESSING CIRCUIT AND CLOCK MULTIPLYING CIRCUIT

(75) Inventor: Minoru Kozaki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/330,017

(22) Filed: Dec. 26, 2002

(65) Prior Publication Data

US 2003/0137333 A1 Jul. 24, 2003

(30) Foreign Application Priority Data

Dec. 25, 2001 (JP) ........................................ 2001-392663

(51) Int. Cl.[7] .............................................. H03L 7/06
(52) U.S. Cl. ...................... 327/144; 327/298; 327/112; 326/85; 326/87
(58) Field of Search ................................ 327/144, 291, 327/293, 296, 298, 111, 112; 326/85–88

(56) References Cited

U.S. PATENT DOCUMENTS

| | | | | |
|---|---|---|---|---|
| 4,542,310 A | * | 9/1985 | Ellis et al. ................... | 327/410 |
| 4,992,676 A | * | 2/1991 | Gerosa et al. ................ | 326/27 |
| 5,138,200 A | * | 8/1992 | Barsanti et al. .............. | 326/88 |
| 5,153,464 A | * | 10/1992 | Joly ............................ | 326/56 |
| 5,296,766 A | * | 3/1994 | Masaki ....................... | 327/387 |
| 5,463,337 A | | 10/1995 | Leonowich .................. | 327/158 |
| 6,137,336 A | * | 10/2000 | Baba et al. .................. | 327/295 |
| 6,417,714 B1 | * | 7/2002 | Biyabani et al. ............. | 327/278 |

FOREIGN PATENT DOCUMENTS

| | | |
|---|---|---|
| JP | 10-294649 | 11/1998 |
| JP | 11-004147 | 1/1999 |
| JP | 2001-209454 | 8/2001 |

OTHER PUBLICATIONS

Communication from Chinese Patent Office re: counterpart application.

* cited by examiner

*Primary Examiner*—Timothy P. Callahan
*Assistant Examiner*—An T. Luu
(74) *Attorney, Agent, or Firm*—Harness, Dickey & Pierce, P.L.C.

(57) ABSTRACT

In a circuit block BL1, a PMOS transistor P1 and a PMOS transistor P1' are connected in series between a high-level potential HL and an output terminal U1; an NMOS transistor N1 and an NMOS transistor N1' are connected in series between a low-level potential LL and the output terminal U1. An inversion signal Ck1B of a clock signal Ck1 is inputted to the gate of the PMOS transistor P1; the inversion signal Ck1B of the clock signal Ck1 is inputted to the gate of the PMOS transistor P1' through an inverter IV1; a clock signal Ck2 is inputted to the gate of the NMOS transistor N1; and the clock signal Ck2 is inputted to the gate of the NMOS transister N1' through an inverter IV2.

8 Claims, 6 Drawing Sheets

[FIG. 1]
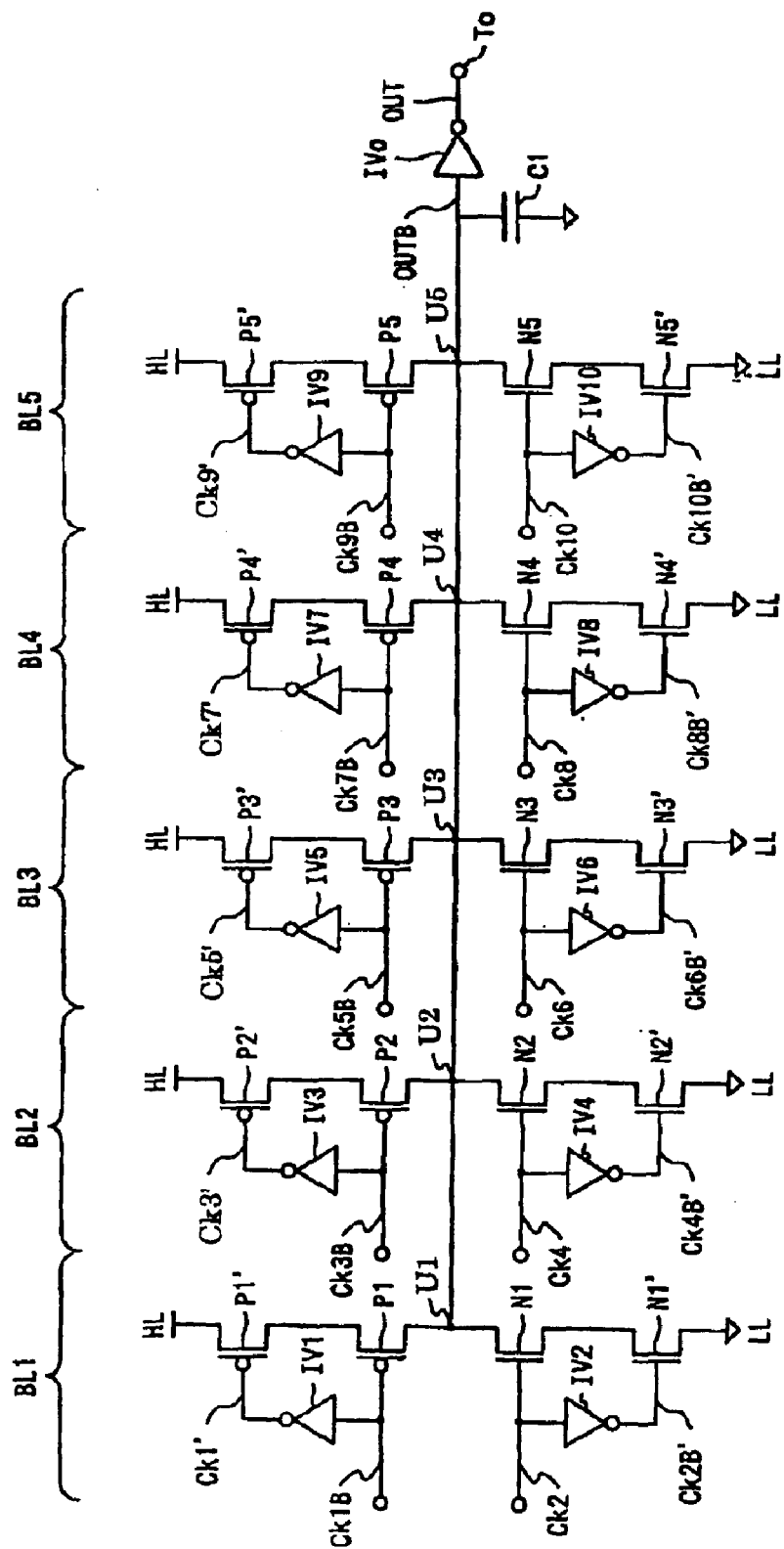

[FIG. 2]
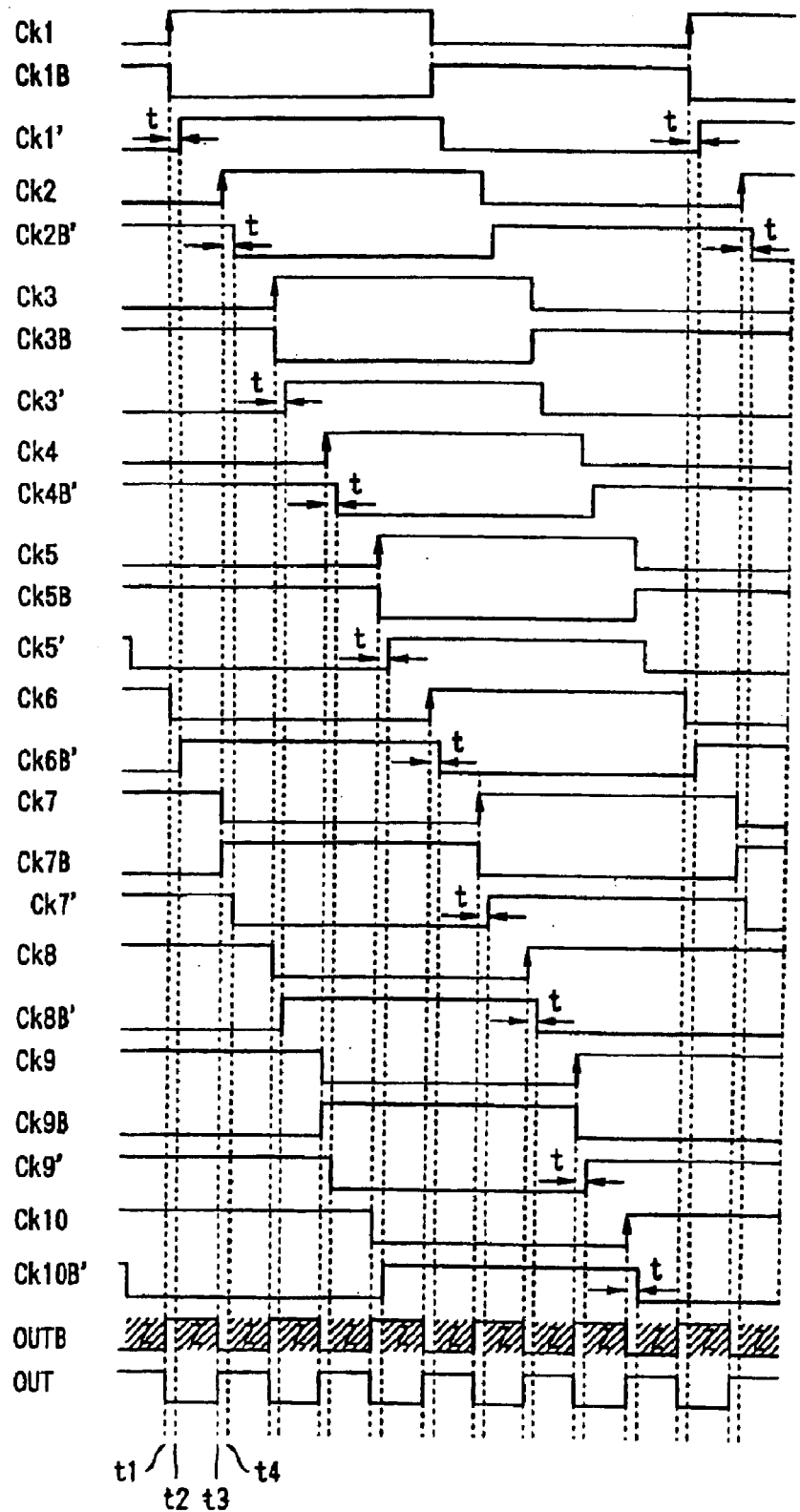

[FIG. 3]
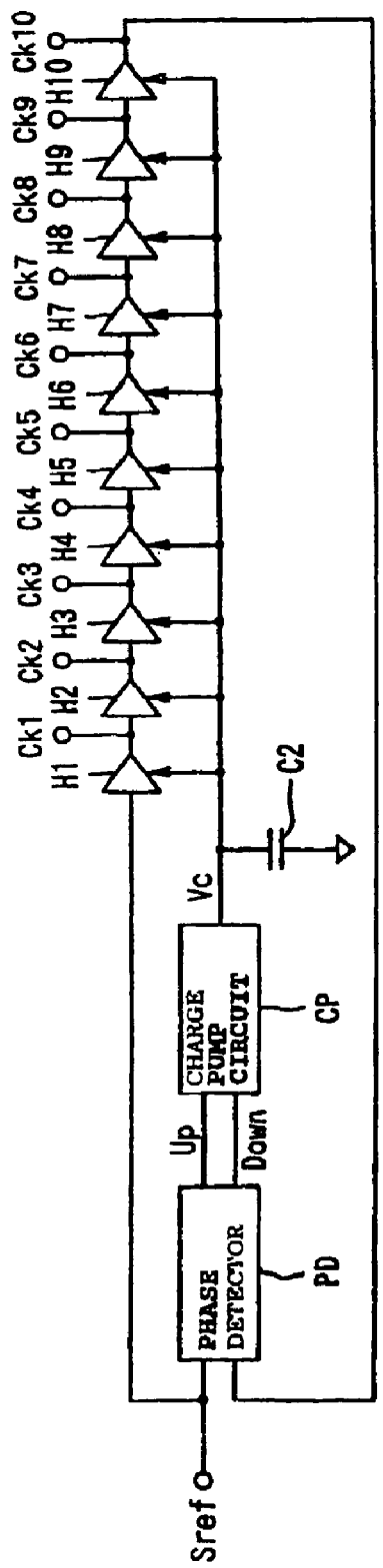

[FIG. 4]
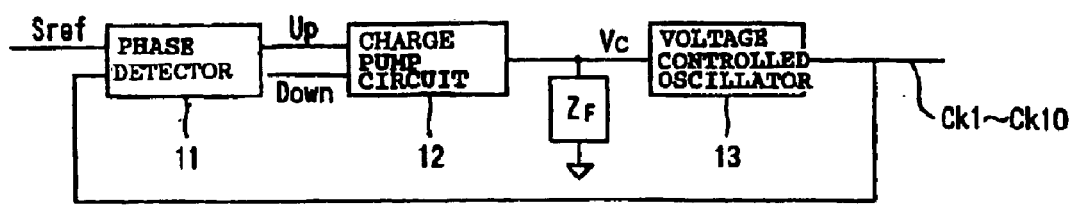
[FIG. 5]
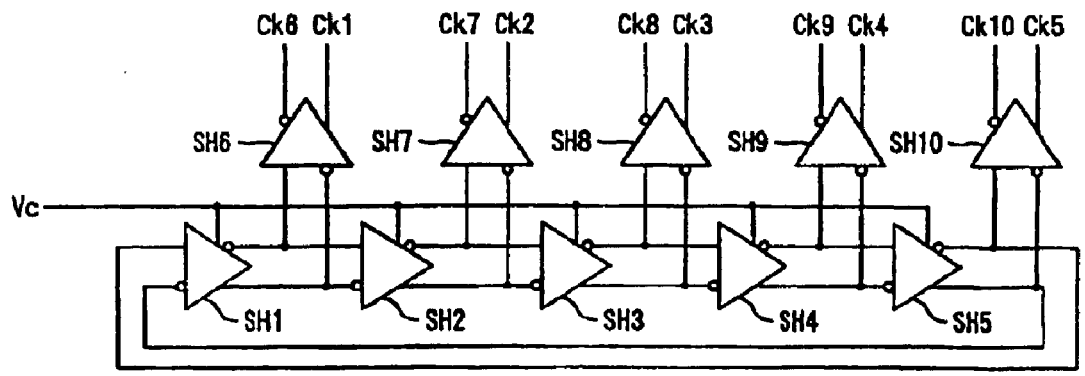

[FIG. 6]
—PRIOR ART—
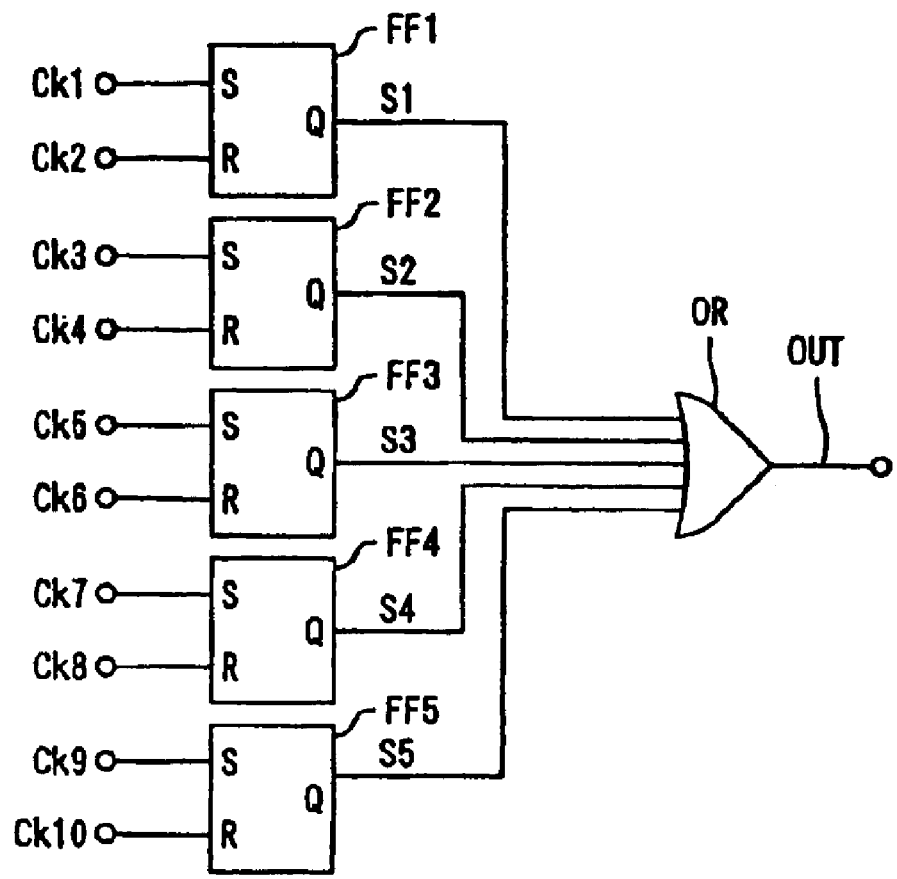

[Fig. 7] —PRIOR ART—
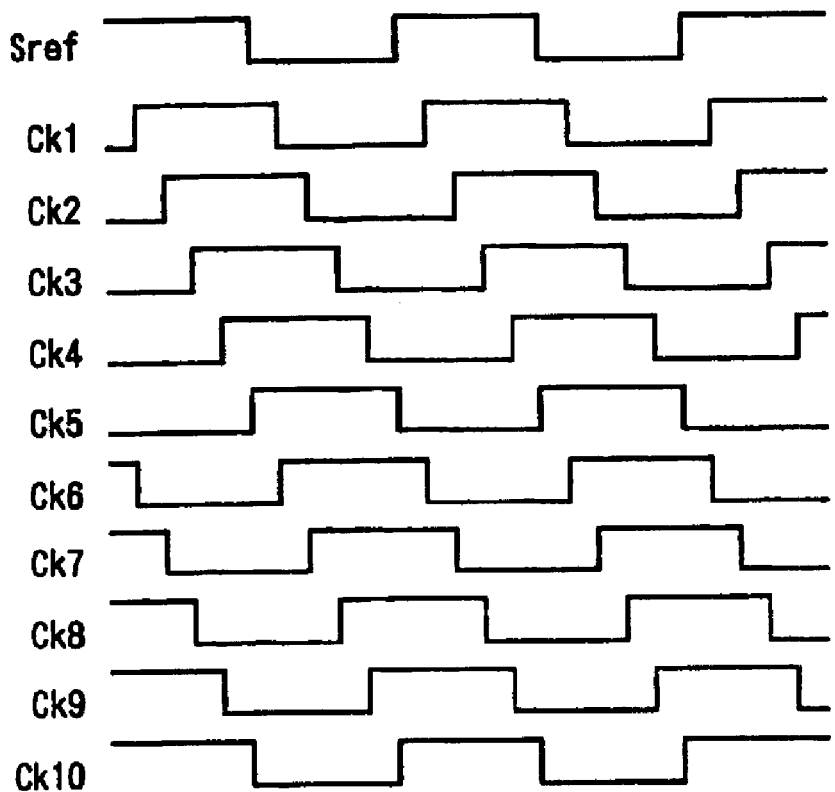
[FIG. 8]
—PRIOR ART—
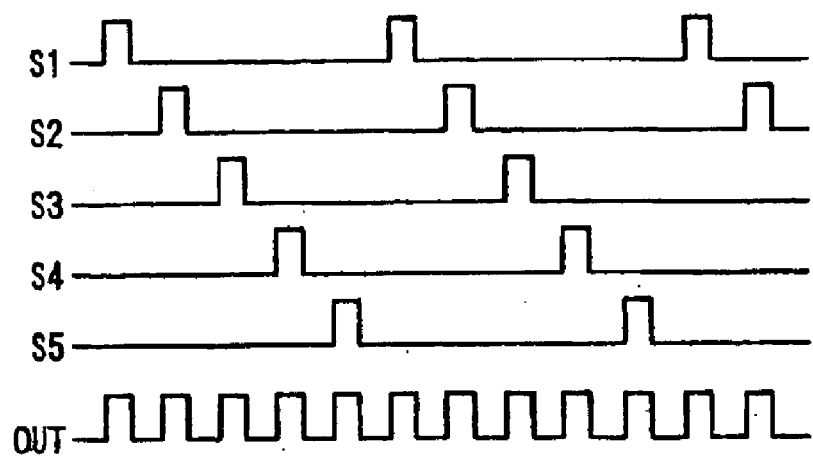

MULTIPHASE-CLOCK PROCESSING CIRCUIT AND CLOCK MULTIPLYING CIRCUIT

DETAILED DESCRIPTION OF THE INVENTION

1. Technical Field of the Invention

The present invention relates to a multiphase-clock processing circuit and a clock multiplying circuit, and more particularly, the invention is suitable for a case in which a multiplied clock is directly generated from a multiphase-clock without converting the multiphase-clock to nonoverlap pulses.

2. Description of the Related Art

Some conventional clock multiplying circuits generate nonoverlap pulses utilizing a phase shift of a multiphase-clock and obtain N-fold clock frequency by obtaining the OR of the nonoverlap pulses.

Here, the multiphase-clock consists of a 2N number of clock signals with a phase shift of ($\pi/N$).

The clock multiplying circuits have used an N number of RS flip-flops to generate nonoverlap pulses from a multiple phase clock and used an N-input OR circuit to obtain the OR of the nonoverlap pulses to generate a multiplied clock.

FIG. 6 is a diagram showing a configuration of a logical clock synthesis circuit used for the conventional clock multiplying circuit. FIG. 7 is a diagram showing an example of a multiphase-clock used in the clock multiplying circuit. FIG. 8 is a diagram showing an example of nonoverlap pulses used to generate a conventional multiplied clock in the conventional clock multiplying circuit. The logical clock synthesis circuit generates N number of nonoverlap pulses from 2N phases of a multiphase-clock and further generates an N-fold multiplied clock from the N nonoverlap pulses, where N=5 in this example.

Referring to FIGS. 6 to 8, the logical clock synthesis circuit includes five RS flip-flops FF1 to FF5 to generate five nonoverlap pulses S1 to S5 from ten multiphase-clocks Ck1 to Ck10 and a multiinput OR circuit OR having five inputs to generate a 5-fold multiplied clock from the five nonoverlap pulses S1 to S5.

The multiphase-clocks Ck1 to Ck10 of FIG. 7 are inputted to the RS flip-flops FF1 to FF5.

More specifically, the clocks Ck1 and Ck2 are inputted to the RS flip-flop FF1; the clocks Ck3 and Ck4 are inputted to the RS flip-flop FF2; the clocks Ck5 and Ck6 are inputted to the RS flip-flop FF3; the clocks Ck7 and Ck8 are inputted to the RS flip-flop FF4; and the clocks Ck9 and Ck10 are inputted to the RS flip-flop FF5.

The RS flip-flops FF1 to FF5 detect the rising edges of the clocks Ck1 to Ck10 and output the nonoverlap pulses S1 to S5 corresponding to the phase shifts among the clocks Ck1 to Ck10.

The nonoverlap pulses S1 to S5 are outputted to input terminals of the multiinput OR circuit OR, where the OR of the nonoverlap pulses S1 to S5 is obtained.

Consequently, as shown in FIG. 8, a multiplied clock OUT having a frequency five-fold of that of the multiphase-clocks Ck1 to Ck10 is outputted from the output terminal of the multiinput OR circuit OR shown in FIG. 6.

However, the conventional clock multiplying circuits use the five RS flip-flops FF1 to FF5 to generate the five nonoverlap pulses S1 to S5 from the multiphase-clocks Ck1 to Ck10 and used the multiinput OR circuit OR to generate the multiplied clock OUT from the nonoverlap pulses S1 to S5.

Here, there was a problem in that when the RS flip-flops FF1 to FF5 were used to generate the nonoverlap pulses S1 to S5 from the multiphase-clocks Ck1 to Ck10, the circuit scale became large which increases a chip area and power consumption, and also increases circuit mismatching between the nonoverlap pulses S1 to S5, causing jitter of the multiplied clock OUT.

Also, there was a problem in that when the multiinput OR circuit OR was used to generate the multiple clock OUT from the nonoverlap pulses S1 to S5, it became difficult to cope with an increase in the number of input terminals while restraining an increase in jitter and power consumption.

Accordingly, one object of the present invention is to provide a multiphase-clock processing circuit and a clock multiplying circuit capable of generating a multiplied clock directly from a multiplied-clock.

SUMMARY OF THE INVENTION

In order to solve the above problems, a multiphase-clock processing circuit of the present invention comprises an output-level switching means for alternately switching an output level between a high level and a low level in synchronization with at least either of rising edges and falling edges of a multiphase-clock; and a floating-state setting means for setting the output level to a floating state after the switching of the output level.

Therefore, a pulse signal can be generated only by using rising edges or falling edges of a multiphase-clock, and the output level of the pulse signal can be brought into a floating state; thus, even when a plurality of output levels is composed, the interference of the output levels can be prevented.

A multiphase-clock processing circuit according to another aspect comprises: an electrical-charge accumulating section provided at an output terminal; a first switching element for bringing the output terminal into conduction with a high-level potential for a predetermined period of time in synchronization with rising edges or falling edges of one multiphase-clock; and a second switching element for bringing the output terminal into conduction with a low-level potential for a predetermined period of time in synchronization with rising edges or falling edges of another multiphase-clock.

Thus, a pulse signal can be generated in synchronization with rising edges or falling edges of a multiphase-clock, and the output level of the pulse signal can be maintained unchanged in a floating state.

Therefore, a multiplied clock can be generated directly from the multiphase-clock, so that there is no need to convert the multiphase-clock to nonoverlap pulses to generate a multiplied clock from a multiphase-clock.

Consequently, the need for RS flip-flops for generating nonoverlap pulses from a multiphase-clock is eliminated, and the need for a multiinput OR circuit for generating a multiplied clock from the nonoverlap pulse is also eliminated. Thus, even when the number of input terminals of the multiphase-clock is increased, an increase in the circuit scale can be reduced to prevent an increase in a chip area and power consumption, and mismatching of the circuits among the pulses can be decreased to reduce jitter.

According to a multiphase-clock processing circuit according to another aspect, the predetermined period of time is smaller than the amount of phase shift of the multiphase-clock.

Therefore, even when a plurality of the first switching elements and a plurality of the second switching elements are connected in parallel, only one of the switching elements can be brought into conduction and the remaining switching elements can be brought into a floating state; thus, the plurality of switching elements is prevented from coming into conduction simultaneously and the interference of the output levels of the switching elements can be prevented.

According to a multiphase-clock processing circuit according to another aspect, the plurality of first switching elements and second switching elements are connected in parallel; and the first switching elements and the second switching elements are alternately brought into conduction in synchronization with the rising edges or the falling edges of each phase of the multiphase-clock.

Thus, the output level of the output terminal can be switched between a high level and a low level alternately every time each phase of the multiphase-clock rises or falls, and the output level can be brought into a floating state. Even when the output terminals of the plurality switching elements are connected in common, the output levels of all the switching elements can be made to coincide with the output level of one of the switching elements.

Therefore, only by connecting the plurality of first and second switching elements in parallel, the output levels of the switching elements can be composed while preventing the interference with the outputs of the other switching elements; thus, the need for using the multiinput OR circuit to compose the output levels of the switching elements is eliminated. Accordingly, the frequency of the multiplied clock can easily be increased by increasing the input terminals of the multiphase-clock without increasing the operating voltage.

Furthermore, the duty ratio of the multiplied clock can be specified by the input timing of only either of the rising edges and the falling edges. Therefore, even when the duty ratio of the multiphase-clock is deviated, the duty ratio of the multiplied clock can be aligned as long as either of the rising edges and the falling edges has an input timing of constant interval; then, the quality of clocks can be improved.

According to a multiphase-clock processing circuit according to another aspect, an N number of the first switching elements and an N number of the second switching elements are connected in parallel; an n (n=1 to N)-th first switching element is brought into conduction in synchronization with the rising edges or falling edges of (2n−1)-th phase of 2N phases of the multiphase-clock; and an n (n=1 to N)-th second switching element is brought into conduction in synchronization with the rising edges or the falling edges of (2n−1)-th phase of 2N phases of the multiphase-clock.

Thus, a multiplied clock having a frequency N times that of the multiphase-clock can be generated only by connecting the N number of first switching elements and the N number of second switching elements in parallel. Therefore, the need for using RS flip-flops and a multiinput OR circuit to generate a multiplied clock having an N-fold frequency is eliminated, thereby allowing an increase in the circuit scale to be reduced to prevent an increase in the chip area and power consumption and a high-frequency clock to be easily provided while reducing jitter.

According to a multiphase-clock processing circuit according to another aspect, the first switching element comprises: first and second P-channel field-effect transistors connected in series between the high-level potential and the output terminal; and a first inverter for delaying an inversion signal of a multiphase-clock inputted to a gate terminal of either one of the first and second P-channel field-effect transistors by the predetermined period of time and outputting the signal to a gate terminal of the other P-channel field-effect transistor; and the second switching element comprises: first and second N-channel field-effect transistors connected in series between the low-level potential and the output terminal; and a second inverter for delaying a multiphase-clock inputted to a gate terminal of either one of the first and second N-channel field-effect transistors by the predetermined period of time and outputting the multiphase-clock to a gate terminal of the other N-channel field-effect transistor.

Accordingly, by connecting the four transistors in series, every time each phase of the multiphase-clock rises or falls; the output level of the output terminal can be switched alternately between a high level and a low level and also the output level can be brought into a floating state.

Consequently, a multiplied clock can be generated directly from a multiphase-clock; thus, the need for converting a multiphase-clock to nonoverlap pulses to generate a multiplied clock from a multiphase-clock is eliminated.

Only by connecting the serially-connected four transistors in parallel, an increase in the number of the input terminals of the multiphase-clock can be coped with; a higher-frequency clock can be provided while realizing a low-voltage operation; and a symmetric structure of the inputs can be maintained to prevent the degradation of the quality of the multiplied clock irrespective of the number of inputs of the multiphase-clock.

Consequently, the need for RS flip-flops and a multiinput OR circuit for generating a multiplied clock from a multiphase-clock can be eliminated, thereby preventing an increase in the circuit scale to reduce an increase in the chip area and power consumption and reducing jitter.

A clock multiplying circuit according to another aspect comprises a multiphase-clock generating circuit for generating a multiphase-clock; and a multiphase-clock processing circuit for generating a multiplied clock directly from the multiphase-clock.

Therefore, the need for generating nonoverlap pulses in order to generate a multiplied clock from a multiphase-clock is eliminated; thus, the need for using RS flip-flops and a multiinput OR circuit is eliminated. Consequently, an increase in the circuit scale is prevented to reduce an increase in the chip area and power consumption and a high-frequency clock can easily be provided while reducing jitter.

According to a clock multiplying circuit according to another aspect, the multiphase-clock generating circuit further comprises at least one of a PLL (phase locked loop) circuit and a DLL (delay locked loop) circuit.

Using the PLL circuit or the DLL circuit allows the multiphase-clock to be generated easily.

Particularly, using the PLL circuit allows a multiphase-clock having a uniform phase shift to be generated easily.

On the other hand, using the DLL circuit allows the generation of a clock having N-fold frequency without using an oscillator, thus preventing the generation of a low-frequency noise inherent to an oscillator.

According to a clock multiplying circuit according to another aspect, the multiphase-clock processing circuit comprises: an electrical-charge accumulating section provided at an output terminal; a first switching element for bringing the output terminal into conduction with a high-level potential for a predetermined period of time in synchronization with rising edges or falling edges of one of multiphase-clock; and a second switching element for bringing the output terminal into conduction with a low-level potential for a predetermined period of time in synchronization with rising edges or falling edges of another multiphase-clock.

Therefore, a multiplied clock can be generated directly from a multiphase-clock; thus, the need for converting a multiphase-clock to nonoverlap pulses in order to generate a multiplied clock from a multiphase-clock is eliminated.

Consequently, the need for RS flip-flops for generating nonoverlap pulses from a multiphase-clock and also a multiinput OR circuit for generating a multiplied clock from nonoverlap pulses can be eliminated; thus, an increase in the circuit scale can be prevented to reduce an increase in the chip area and power consumption and jitter can also be reduced.

According to a clock multiplying circuit according to another aspect, the multiphase-clock processing circuit includes a plurality of the first switching elements and a plurality of the second switching elements connected in parallel; wherein the first switching elements and the second switching elements are alternately brought into conduction in synchronization with the rising edges or the falling edges of each phase of the multiphase-clock.

Therefore, only by connecting the plurality of first switching elements and second switching elements in parallel, the output levels of the switching elements can be overlapped on one time series while preventing the interference with the outputs of the other switching elements; thus, the frequency of the multiplied clock can easily be increased by increasing the input terminals of the multiphase-clock without increasing an operating voltage.

According to a clock multiplying circuit according to another aspect, the multiphase-clock processing circuit includes N number of the first switching elements and N number of the second switching elements connected in parallel; wherein an n (n=1 to N)-th first switching element is brought into conduction in synchronization with the rising edges or falling edges of (2n−1)-th phase of 2N phases of the multiphase-clock; and an n (n=1 to N)-th second switching element is brought into conduction in synchronization with the rising edges or falling edges of (2n)-th phase of 2N phases of the multiphase-clock.

Therefore, only by connecting the N number of first switching elements and the N number of second switching elements in parallel, a multiplied clock having a frequency N times that of the multiphase-clock can be generated. Therefore, the need for using RS flip-flops and a multiinput OR circuit to generate a multiplied clock having an N-fold frequency is eliminated; thus, an increase in the circuit scale can be prevented to reduce an increase in the chip area and power consumption and also a high-frequency clock can easily be provided while reducing jitter.

According to a clock multiplying circuit according to another aspect, the first switching element comprises: first and second P-channel field-effect transistors connected in series between the high-level potential and the output terminal; and a first inverter for delaying an inversion signal of a multiphase-clock inputted to a gate terminal of either one of the first and second P-channel field-effect transistors by the predetermined period of time and outputting it to a gate terminal of the other P-channel field-effect transistor; and the second switching element comprises: first and second N-channel field-effect transistors connected in series between the low-level potential and the output terminal; and a second inverter for delaying a multiphase-clock inputted to a gate terminal of either one of the first and second N-channel field-effect transistors by the predetermined period of time and outputting it to agate terminal of the other N-channel field-effect transistor.

Accordingly, by connecting the four transistors in series, a multiplied clock can be generated directly from a multiphase-clock; thus, the need for converting a multiphase-clock to nonoverlap pulses in order to generate a multiplied clock from a multiphase-clock is eliminated.

Consequently, in order to generate a multiplied clock from a multiphase-clock, the need for RS flip-flops and a multi-input OR circuit can be eliminated; thus, an increase in the circuit scale can be prevented to reduce an increase in the chip area and power consumption and jitter can also be reduced.

Even when the number of inputs of the multiphase-clock is increased, a multiplied clock can be generated by connecting the switching elements in parallel in correspondence with the number of the inputs; thus, the need for increasing the serial connections of the transistors is eliminated, thereby allowing a low-voltage IC process to be easily applied.

Additionally, the switching elements that are connected in parallel to the input terminals of the multiphase-clock are allowed to have the same configuration, and can maintain a symmetric configuration even when the number of the input terminals of the multiphase-clock is increased, thereby allowing the generation of a clock with an N-fold frequency without increasing jitter.

BRIEF DESCRIPTION OF THE DRAWINGS

FIG. 1 is a diagram showing a configuration of a multiphase-clock processing circuit according to an embodiment of the present invention.

FIG. 2 is a timing chart showing the operation of the multiphase-clock processing circuit according to the embodiment of the present invention.

FIG. 3 is a block diagram showing a configuration of a DLL circuit applied to a clock multiplying circuit according to a first embodiment of the present invention.

FIG. 4 is a block diagram showing a configuration of a PLL circuit applied to a clock multiplying circuit according to a second embodiment of the present invention.

FIG. 5 is a diagram showing a configuration of a voltage controlled oscillator of FIG. 4.

FIG. 6 is a diagram showing a configuration of a logical clock synthesis circuit used for a conventional clock multiplying circuit.

FIG. 7 is a diagram showing an example of a multiphase-clock used in the clock multiplying circuit.

FIG. 8 is a diagram showing an example of nonoverlap pulses used for conventional clock multiplying circuit.

DETAILED DESCRIPTION OF THE PREFERRED EMBODIMENTS

A multiphase-clock processing circuit and a clock multiplying circuit according to embodiments of the present invention will be described hereinbelow with reference to the drawings.

FIG. 1 is a diagram showing a configuration of a multiphase-clock processing circuit according to an embodiment of the present invention.

In the following description, a multiphase-clock will be described taking a case in which 2N=10 number of clock signals Ck1 to Ck10 have phase shifts by ($\pi/N=\pi/5$) as an example, as shown in FIG. 7.

Referring to FIG. 1, the multiphase-clock processing circuit is composed of N=5 number of circuit blocks BL1 to BL5 in correspondence to 2N=2×5=10 number of clock signals Ck1 to Ck10, and each of the circuit blocks BL1 to BL5 has two PMOS transistors connected each other in series and two NMOS transistors connected each other in series.

More specifically, in the circuit block BL1, a PMOS transistor P1 and a PMOS transistor P1' are connected in series between a high-level potential HL and an output terminal U1; and an NMOS transistor N1 and an NMOS transistor N1' are connected in series between a low-level potential LL and the output terminal U1.

In the circuit block BL2, a PMOS transistor P2 and a PMOS transistor P2' are connected in series between a high-level potential HL and an output terminal U2; and an NMOS transistor N2 and an NMOS transistor N2' are connected in series between a low-level potential LL and the output terminal U2.

In the circuit block BL3, a PMOS transistor P3 and a PMOS transistor P3' are connected in series between a high-level potential HL and an output terminal U3; and an NMOS transistor N3 and an NMOS transistor N3' are connected in series between a low-level potential LL and the output terminal U3.

In the circuit block BLA, a PMOS transistor P4 and a PMOS transistor P4' are connected in series between a high-level potential HL and an output terminal U4; and an NMOS transistor N4 and an NMOS transistor N4' are connected in series between a low-level potential LL and the output terminal U4.

In the circuit block BL5, a PMOS transistor P5 and a PMOS transistor P5' are connected in series between a high-level potential HL and an output terminal U5; and an NMOS transistor N5 and an NMOS transistor N5' are connected in series between a low-level potential LL and the output terminal U5.

Here, an inversion signal Ck1B of the clock signal Ck1 is inputted to the gate of the PMOS transistor P1, and the inversion signal Ck1B of the clock signal Ck1 is inputted to the gate of the PMOS transistor P1' through an inverter IV1.

The clock signal Ck2 is inputted to the gate of the NMOS transistor N1, and the clock signal Ck2 is inputted to the gate of the NMOS transistor N1' through an inverter IV2.

An inversion signal Ck3B of the clock signal Ck3 is inputted to the gate of the PMOS transistor P2, and the inversion signal Ck3B of the clock signal Ck3 is inputted to the gate of the PMOS transistor P2' through an inverter IV3.

Also, the clock signal Ck4 is inputted to the gate of the NMOS transistor N2, and the clock signal Ck4 is inputted to the gate of the NMOS transistor N2' through an inverter IV4.

An inversion signal Ck5B of the clock signal Ck5 is inputted to the gate of the PMOS transistor P3, and the inversion signal Ck5B of the clock signal Ck5 is inputted to the gate of the PMOS transistor P3' through an inverter IV5.

Also, the clock signal Ck6 is inputted to the gate of the NMOS transistor N3, and the clock signal Ck6 is inputted to the gate of the NMOS transistor N3' through an inverter IV6.

An inversion signal Ck7B of the clock signal Ck7 is inputted to the gate of the PMOS transistor P4, and the inversion signal Ck7B of the clock signal Ck7 is inputted to the gate of the PMOS transistor P4' through an inverter IV7.

Also, the clock signal Ck8 is inputted to the gate of the NMOS transistor N4, and the clock signal Ck8 is inputted to the gate of the NMOS transistor N4' through an inverter IV8.

An inversion signal Ck9B of the clock signal Ck9 is inputted to the gate of the PMOS transistor P5, and the inversion signal Ck9B of the clock signal Ck9 is inputted to the gate of the PMOS transistor P5' through an inverter IV9.

Also, the clock signal Ck10 is inputted to the gate of the NMOS transistor N5, and the clock signal Ck10 is inputted to the gate of the NMOS transistor N5' through an inverter IV10.

The respective output terminals U1 to U5 of the circuit blocks BL1 to BL5 are connected in common, and connected to an output terminal T0 through an inverter IVo. The output terminals U1 to U5 have a parasitic capacitance C1.

The inverters IV1 to IV10 invert the input signals and are provided to secure required minimum delay time of the input signals. The inverters IV1 to IV10 are designed such that the driving capacity is decreased intentionally in order to secure necessary delay time.

While the example of FIG. 1 has described a method of inputting input signals to the gates of the PMOS transistors P1' to P5' and the NMOS transistors N1' to N5' through the inverters IV1 to IV10 of one stage, the input signals may be inputted to the gates of the PMOS transistors P1' to P5' and the NMOS transistors N1' to N5' through an odd number of inverters in order to control the delay amount of the input signals.

While the example of FIG. 1 has described a method of providing the inverters IV1 to IV10 at the respective gates of the PMOS transistors P1' to P5' and the NMOS transistors N1' to N5', they may be provided at the respective gates of the PMOS transistors P1 to P5 and the NMOS transistors N1 to N5.

FIG. 2 is a timing chart showing the operation of the multiphase-clock processing circuit according to the embodiment of the present invention. In the following description, the delay time of the inverters IV1 to IV10 is set to t.

When the clock signal Ck1 rises (when changing from a low level to a high level) at time t1 in FIG. 2, the inversion signal Ck1B thereof falls (changes from a high level to a low level).

The inversion signal Ck1B is inputted to the gate of the PMOS transistor P1, so that the PMOS transistor P1 is turned on.

On the other hand, the inverter IV1 is connected to the gate of the PMOS transistor P1', and the Ck1B is inputted to the gate of the PMOS transistor P1' through the inverter IV1.

Therefore, the clock signal Ck1' inputted to the gate of the PMOS transistor P1' rises (changes from a low level to a high level) with a delay of delay time t behind fall time t1 of the inversion signal Ck1B, so that the gate of the PMOS transistor P1' remains at a low level at time t1.

Consequently, the PMOS transistor P1 is turned on at time t1, and the on-state of the PMOS transistor P1' is maintained as it is; thus, the output terminal U1 is brought into conduction with a high-level potential.

On the other hand, the clock signal Ck2 is at a steady level at time t1 and at least one of the NMOS transistors N1 and N1' is turned off, so that the output terminal U1 is cut off from a low-level potential.

Consequently, the output terminal U1 of the circuit block BL1 changes to a high level.

Also, the clock signals Ck3 to Ck10 except the clock signal Ck6 of the other circuit blocks BL2 to BL5 are at a steady level at time t1, and the inversion signal Ck6' of the clock signal Ck6 is at a low level at time t1, so that the NMOS transistor N3' is in off state.

Therefore, at time t1, the output terminals U2 to U5 of the other circuit blocks BL2 to BL5 are cut off from either of the high-level and low-level potentials to enter a floating state.

Consequently, even when the output terminals U1 to U5 of the circuit blocks BL1 to BL5 are connected in common, the output of the output terminal U1 of the circuit block BL1 can be prevented from interfering with the outputs of the other circuit blocks BL2 to BL5 at time t1.

Therefore, at time t1, the total output OUTB of the circuit blocks BL1 to BL5 is specified depending on the output from the output terminal U1 of the circuit BL1, the level of the output terminal U1 of the circuit BL1 is inverted by the inverter IVo, and the multiplied clock OUT changes from a high level to a low level.

Next, at time t2 when delay time t is elapsed from time t1, the clock signal Ck1' delayed by the inverter IV1 rises to cause the gate of the PMOS transistor P1' to enter a high level, so that the PMOS transistor P1' is turned off.

Consequently, the output terminal U1 is cut off from the high-level potential to enter a floating state (shown by character Z in FIG. 2).

Even when the output terminal U1 is in a floating state, since the output terminal U1 has the parasitic capacitance C1, the total output OUTB of the circuit blocks BL1 to BL5 can be maintained at a high level, and the multiplied clock OUT can be maintained at a low level by a charge storing action of the parasitic capacitance C1.

At time t3, the clock signal Ck2 rises (changes from a low level to a high level), and the clock signal Ck2 is inputted to the gate of the NMOS transistor N1, so that the NMOS transistor N1 is turned on.

On the other hand, the inverter IV2 is connected to the gate of the NMOS transistor N1', and the clock signal Ck2 is inputted to the gate of the NMOS transistor N1' through the inverter IV2.

Therefore, the clock signal Ck2B' inputted to the gate of the NMOS transistor N1' falls (changes from a high level to a low level) with a delay of delay time t behind rise time t3 of the clock signal Ck2, so that the gate of the NMOS transistor N1' remains at a high level at time t3.

Consequently, at time t3, the NMOS transistor N1 is turned on, and the on-state of the NMOS transistor N1' is maintained as it is; thus, the output terminal U1 is brought into conduction to a low-level potential.

On the other hand, the clock signal Ck1 is at a steady level at time t3 and at least one of the PMOS transistors P1 and P1' is turned off, so that the output terminal U1 is cut off from a high-level potential.

Consequently, the output terminal U1 of the circuit block BL1 changes to a low level.

Also, the clock signals Ck3 to Ck10 except the clock signal Ck7 of the other circuit blocks BL2 to BL5 are at a steady level at time t3, and the inversion signal Ck7' of the clock signal Ck7 is at a high level at time t7, so that the PMOS transistor P4' is in off state.

Therefore, at time t3, the output terminals U2 to U5 of the other circuit blocks BL2 to BL5 are cut off from either of the high-level and low-level potentials to enter a floating state.

Consequently, even when the output terminals U1 to U5 of the circuit blocks BL1 to BL5 are connected in common, the output of the output terminal U1 of the circuit block BL1 can be prevented from interfering with the outputs of the other circuit blocks BL2 to BL5 at time t3.

Therefore, at time t3, the total output OUTB of the circuit blocks BL1 to BL5 is specified depending on the output from the output terminal U1 of the circuit block BL1, the level of the output terminal U1 of the circuit block BL1 is inverted by the inverter IVo, and the multiplied clock OUT changes from a low level to a high level.

Next, at time t4 when delay time t is elapsed from time t3, the clock signal Ck2B' delayed by the inverter IV2 falls to cause the gate of the NMOS transistor N1' to enter a low level, so that the NMOS transistor N1' is turned off.

Consequently, the output terminal U1 is cut off from the low-level potential to enter the floating state (shown by character Z in FIG. 2).

Even when the output terminal U1 is in the floating state, since the output terminal U1 has the parasitic capacitance C1, the total output OUTB of the circuit blocks BL1 to BL5 can be maintained at a low level, and the multiplied clock OUT can be maintained at a high level by a charge storing action of the parasitic capacitance C1.

Hereinafter, similar operations are repeated for the other clock signals Ck3 to Ck10 by the circuit blocks BL2 to BL5.

Therefore, the multiplied clock OUT repeats the state transition between the high level and the low level every time the multiphase-clocks Ck1 to Ck10 rise in sequence; thus, an multiplied clock OUT having a frequency five times that of the multiphase-clocksCk1 to Ck10 can be generated.

As described above, after the levels of the output terminals U1 to U5 of the circuit blocks BL1 to BL5 have changed, the output terminals U1 to U5 are brought into a floating state; thus, even when the output terminals U1 to U5 of the circuit blocks BL1 to BL5 are connected in common, the outputs of the circuit blocks BL1 to BL5 can be made to the total output of the circuit blocks BL1 to BL5 while preventing the interference of the outputs therebetween.

Consequently, even when the number of phases of the multiphase-clock is increased, a multiplied clock can be generated only by connecting the circuit blocks BL1 to BL5 in parallel; thus, there is no need to use a multiinput OR circuit in order to compose the outputs from the circuit blocks BL1 to BL5.

Therefore, even when the number of phases of the multiphase-clock is increased, there is no need to increase the number of serial connections of the transistors; thus, high-frequency clocks can be obtained using low-voltage IC process.

Also, even when the number of phases of the multiphase-clock is increased, all that is needed is to connect the circuit blocks BL1 to BL5 in parallel; thus, a symmetric configuration of the input terminals can be maintained, so that high-frequency clocks can be obtained while suppressing an increase in jitter.

Since the multiplied clock OUT can be directly generated by using only the rising edges of the multiphase-clocks Ck1 to Ck10, there is no need for the RS flip-flops for generating nonoverlap pulses from the multiphase-clocks Ck1 to Ck10.

Accordingly, even when the number of input terminals of the multiphase-clocks Ck1 to Ck10 is increased, an increase in the chip area and power consumption can be prevented by reducing an increase in the circuit scale and also jitter can be reduced by decreasing mismatching of the circuit blocks BL1 to BL5 between the phases of the multiphase-clocks Ck1 to Ck10.

Furthermore, the multiplied clock OUT is generated using only the rising edges of the multiphase-clocks Ck1 to Ck10; accordingly, even when the duty ratio of the multiphase-clocks Ck1 to Ck10 is deviated from 50%, the duty ratio of the multiplied clock OUT can be maintained at 50%, and the pulses can be prevented from disappearing because the duty ratio of the multiplied clock OUT falls below 0% or exceeds 100%.

In order to prevent the interference between the outputs of the circuit blocks BL1 to BL5 when the output terminals U1 to U5 of the circuit blocks BL1 to BL5 are connected in common, the delay time t of each of the inverters IV1 to IV10 must be set smaller than the amount of the phase shift ($\pi$/N) of the multiphase-clock.

Next, a clock multiplying circuit incorporating the multiphase-clock processing circuit of FIG. 1 will be described.

FIG. 3 is a block diagram showing a configuration of a DLL circuit applied to a clock multiplying circuit according to a first embodiment of the present invention.

Referring to FIG. 3, the DLL circuit includes a phase detector PD, a charge pump circuit CP, a capacitor C2, and variable delay circuits H1 to H10.

Here, the variable delay circuits H1 to H10 are connected in cascade, from which the multiphase-clocks Ck1 to Ck10 are outputted, respectively. To the first stage of the variable delay circuits H1 to H10, a reference signal Sref of FIG. 7 is inputted, and the output signal Ck10 in the last stage of the variable delay circuits H1 to H10 is fed back to the phase detector PD.

The signal Ck10 fed back to the phase detector PD is compared with the reference signal Sref at the phase detector PD, and an Up signal or a Down signal is outputted to the charge pump circuit CP in correspondence to the phase difference between the signal Ck10 and the reference signal Sref.

The charge pump circuit CP charges electrical charges in the capacitor C2 when the Up signal is outputted, and discharges the electrical charges accumulated in the capacitor C2 when the Down signal is outputted. A voltage specified by the electrical charges accumulated in the capacitor C2 is outputted to the variable delay circuits HI to H10 as a control voltage Vc.

The amount of delay of the variable delay circuits H1 to H10 is varied depending on the control voltage Vc, and the amount of phase shifts of the respective multiphase-clocks Ck1 to Ck10 outputted from the variable delay circuits H1 to H10 is controlled so that the phases between the signal Ck10 and the reference signal Sref coincide with each other.

Consequently, ten phases of the multiphase-clocks Ck1 to Ck10 having a phase shift of 1/10 period can be generated, as shown in FIG. 7.

The multiphase-clocks Ck1 to Ck10 generated in the DLL circuit of FIG. 3 can be used as input signals for the multiphase-clock processing circuit of FIG. 1.

Here, using the DLL circuit to generate the multiphase-clocks Ck1 to Ck10 allows the generation of a clock having an N-fold frequency without using an oscillator, and prevents the generation of low-frequency noise inherent to an oscillator.

FIG. 4 is a block diagram showing a configuration of a PLL circuit applied to a clock multiplying circuit according to a second embodiment of the present invention. FIG. 5 is a diagram showing a configuration of a voltage controlled oscillator of FIG. 4.

Referring to FIGS. 4 and 5, the PLL circuit includes a phase detector 11, a charge pump circuit 12, and a voltage controlled oscillator 13. The voltage controlled oscillator 13 includes differential variable delay inverters SH1 to SH5 and differential inverters SH6 to SH10.

Here, the differential variable delay inverters SH1 to SH5 are cascaded, the last stage of which is connected to the first stage thereof, thus constituting a ring oscillator.

A control voltage Vc outputted from the charge pump circuit 12 is applied to each of the differential variable delay inverters SH1 to SH5; thus, the amount of delay is controlled by the control voltage Vc.

An inversion output terminal of the differential variable delay inverter SH1 connects to a noninversion input terminal of the differential inverter SH6; a noninversion output terminal of the differential variable delay inverter SH1 connects to an inversion input terminal of the differential inverter SH6; an inversion output terminal of the differential variable delay inverter SH2 connects to a noninversion input terminal of the differential inverter SH7; a noninversion output terminal of the differential variable delay inverter SH2 connects to an inversion input terminal of the differential inverter SH7; an inversion output terminal of the differential variable delay inverter SH3 connects to a noninversion input terminal of the differential inverter SH8; a noninversion output terminal of the differential variable delay inverter SH3 connects to an inversion input terminal of the differential inverter SH8; an inversion output terminal of the differential variable delay inverter SH4 connects to a noninversion input terminal of the differential inverter SH9; a noninversion output terminal of the differential variable delay inverter SH4 connects to an inversion input terminal of the differential inverter SH9; an inversion output terminal of the differential variable delay inverter SH5 connects to a noninversion output terminal of the differential inverter SH10; and a noninversion output terminal of the differential variable delay inverter SH5 connects to an inversion input terminal of the differential inverter SH10.

The multiphase-clocks Ck1 to Ck5 are outputted from the noninversion output terminals of the differential inverters SH6 to SH10, respectively, and the multiphase-clocks Ck6 to Ck10 are outputted from the inversion output terminals of the differential inverters SH6 to SH10, respectively.

Any one of the multiphase-clocks Ck1 to Ck10 outputted from the voltage controlled oscillator 13 is inputted to the phase detector 11.

The reference signal Sref of FIG. 7 is inputted to the phase detector 11, where the signal inputted from the voltage controlled oscillator 13 is compared with the reference signal Sref. The Up signal or the Down signal is outputted to the charge pump circuit 12 in correspondence with the phase difference between the signal inputted from the voltage controlled oscillator 13 and the reference signal Sref.

The charge pump circuit 12 increases the control voltage Vc when the Up signal is outputted, drops the control voltage Vc when the Down signal is outputted, and outputs the control voltage Vc to the voltage controlled oscillator 13.

In the voltage controlled oscillator 13, the amount of delay of the differential variable delay inverters SH1 to SH5 is varied depending on the control voltage Vc, and the delay amount of the multiphase-clocks Ck1 to Ck10 outputted from the differential inverters SH6 to SH10 is controlled so that the phases of the signal outputted from the voltage controlled oscillator 13 and the reference signal Sref coincide with each other.

Consequently, ten phases of the multiphase-clocks Ck1 to Ck10 having a phase shift of 1/10 period can be generated, as shown in FIG. 7.

The multiphase-clocks Ck1 to Ck10 generated in the PLL circuit of FIG. 7 can be used as input signals for the multiphase-clock processing circuit of FIG. 1.

Accordingly, a multiphase-clock having a uniform phase shift can easily be generated using the PLL circuit in order to generate the multiphase-clocks Ck1 to Ck10.

In the above-described embodiments, while a method of generating the multiplied clock OUT using the rising edges of the multiphase-clocks Ck1 to Ck10 is described, the multiplied clock OUT may be generated using the falling edges of the multiphase-clocks Ck1 to Ck10.

Also, the multiplied clock may be generated using both the rising edges and the falling edges of the multiphase-clocks; therefore, an N-fold multiplied clock can be generated by using a multiphase-clock with only N phases using the multiple phase clock with 2N phases(provided that N is an odd number).

Advantages of the Invention

As described above, according to the present invention, a multiplied clock can be generated directly from a multiphase-clock, and there is no need to use RS flip-flops and a multiinput OR circuit, thus allowing an increase in a chip area and power consumption to be prevented, and a high-frequency clock to be easily provided while reducing jitter.

The entire disclosure of Japanese Patent Application No. 2001-392663 filed Dec. 25, 2001 is incorporated by reference.

What is claimed is:

1. A multiphase-clock processing circuit comprising:
an electrical-charge accumulating section provided at an output terminal;
a first switching element for bringing said output terminal into conduction with a high-level potential for a first predetermined period of time in synchronization with rising edges or falling edges of a first clock signal; and a second switching element for bringing said output terminal into conduction with a low-level potential for a second predetermined period of time in synchronization with rising edges or falling edges of a second clock signal having a phase shift from the first clock signal, wherein said first and second predetermined periods of time are smaller than an amount of the phase shift of the first and second clock signals.

2. The multiphase-clock processing circuit according to claim 1, wherein:

a plurality of said first switching elements and a plurality of said second switching elements are connected in parallel; and said first switching elements and said second switching elements are alternately brought into conduction in synchronization with the rising edges or the falling edges of each phase of said first and second clock signals.

3. The multiphase-clock processing circuit according to claim 1, wherein:

An N number of said first switching elements and an N number of said second switching elements are connected in parallel;

an n (n=1 to N)-th first switching element is brought into conduction in synchronization with the rising edges or the falling edges of (2n-1)-th phase of 2N phases of the multiphase-clock; and an n (n=1 to N)-th second switching element is brought into conduction in synchronization with the rising edges or the falling edges of (2n)-th phase of 2N phases of the multiphase-clock.

4. The multiphase-clock processing circuit according to claim 1, wherein:

said first switching element comprises:

first and second P-channel field-effect transistors connected in series between said high-level potential and the output terminal; and a first inverter for delaying an inversion signal of the first clock signal inputted to a gate terminal of either one of said first and second P-channel field-effect transistors by said first predetermined period of time and outputting the signal to a gate terminal of the other P-channel field-effect transistor; and said second switching element comprises:

first and second N-channel field-effect transistors connected in series between said low-level potential and the output terminal; and a second inverter for delaying the second clock signal, and the second clock signal is input to a gate terminal of either one of said first and second N-channel field-effect transistors by said second predetermined period of time and outputting the second clock signal to a gate terminal of the other N-channel field-effect transistor.

5. A clock multiplying circuit comprising, a multiphase-clock generating circuit for generating a multiphase-clock;

a multiphase-clock processing circuit for generating a multiplied clock directly from said multiphase-clock, wherein said multiphase-clock processing circuit comprises:

an N number of first switching elements and an N number of said second switching elements connected in parallel, wherein an n (n=1 to N)-th first switching element is brought into conduction in synchronization with the rising edges or the falling edges of (2n-1)-th phase of 2N phases of the multiphase-clock; and an n (n=1 to N)-th second switching element is brought into conduction in synchronization with the rising edges or the falling edges of (2n)-th phase of 2N phases 6. The clock multiplying circuit of claim 5, wherein said multiphase-clock processing circuit further comprises:

an electrical-charge accumulating section provided at an output terminal.

7. The clock multiplying circuit according to claim 6, wherein said multiphase-clock generating circuit further comprises at least one of a PLL circuit and a DLL circuit.

8. The clock multiplying circuit according to claim 5, wherein:

each of said first switching elements comprise:

first and second P-channel field-effect transistors connected in series between said high-level potential and the output terminal; and a first inverter for delaying an inversion signal of the first clock signal inputted to a gate terminal of either one of said first and second P-channel field-effect transistors by said first predetermined period of time and outputting the signal to a gate terminal of the other P-channel field-effect transistor; and each of said second switching elements comprise:

first and second N-channel field-effect transistors connected in series between said low-level potential and the output terminal; and a second inverter for delaying the second clock signal, and the second clock signal is input to a gate terminal of either one of said first and second N-channel field-effect transistors by said second predetermined period of time and outputting the second clock signal to a gate terminal of the other N-channel field-effect transistor.

* * * * *

UNITED STATES PATENT AND TRADEMARK OFFICE
CERTIFICATE OF CORRECTION

PATENT NO. : 6,967,512 B2 Page 1 of 1
APPLICATION NO. : 10/330017
DATED : November 22, 2005
INVENTOR(S) : Minoru Kozaki It is certified that error appears in the above-identified patent and that said Letters Patent is hereby corrected as shown below:

Column 7, Line 13: "BLA," should be -- BL4, --

Column 14, Line 21: after "phases" insert -- of the multiphase-clock. --

Signed and Sealed this

Nineteenth Day of September, 2006

JON W. DUDAS
*Director of the United States Patent and Trademark Office*